(12) United States Patent
Park et al.

(10) Patent No.: US 10,635,990 B1
(45) Date of Patent: Apr. 28, 2020

(54) QUANTUM CIRCUIT ASSEMBLY WITH A DIGITAL-TO-ANALOG CONVERTER AND AN ARRAY OF ANALOG MEMORY CELLS

(71) Applicant: Intel Corporation, Santa Clara, CA (US)

(72) Inventors: Jong Seok Park, Hillsboro, OR (US); Stefano Pellerano, Beaverton, OR (US); Sushil Subramanian, Hillsboro, OR (US); Shavindra Priyanath Premaratne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/561,133

(22) Filed: Sep. 5, 2019

(51) Int. Cl.
*G06N 10/00* (2019.01)
*G11C 27/02* (2006.01)
*B82Y 10/00* (2011.01)

(52) U.S. Cl.
CPC .......... *G06N 10/00* (2019.01); *G11C 27/024* (2013.01); *B82Y 10/00* (2013.01)

(58) Field of Classification Search
None
See application file for complete search history.

(56) References Cited

U.S. PATENT DOCUMENTS

| 9,015,215 B2* | 4/2015 | Berkley | B82Y 10/00 |
|---|---|---|---|
| | | | 708/200 |
| 2012/0074386 A1 | 3/2012 | Rachmady et al. | |
| 2013/0264617 A1 | 10/2013 | Joshi et al. | |
| 2019/0251478 A1* | 8/2019 | Bishop | G06N 10/00 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.

(Continued)

*Primary Examiner* — Jeffery S Zweizig
(74) *Attorney, Agent, or Firm* — Patent Capital Group

(57) ABSTRACT

An example quantum circuit assembly includes a quantum circuit component with a plurality of qubits operable by selectively applying control signals to various terminals of the qubits. The assembly further includes an array of analog memory cells, a DAC configured to sequentially generate analog values/signals to be stored in different ones of the analog memory cells, and a switching arrangement configured to selectively apply control signals to various ones of qubit terminals, where each control signal is applied by the switching arrangement electrically connecting an output terminal of a different analog memory cell of the array of analog memory cells to one of the qubit terminals. Performing digital-to-analog conversion ahead of performing qubit operations and storing results of the conversion in different analog memory cells allows pre-generating and storing analog voltages required for qubit operations that may be carried out during the qubit coherence time.

20 Claims, 13 Drawing Sheets

(56) References Cited

OTHER PUBLICATIONS

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Defect reduction of selective Ge epitaxy in trenches on Si(001) substrates using aspect ratio trapping," Park et al., Applied Physics Letter 90, 052113 (2007), pp. 052113-1 through 052113-3.
"Photon- and phonon-assisted tunneling in the three-dimensional charge stability diagram of a triple quantum dot array," Braakman et al., Applied Physics Letters 102, 112110 (2013), pp. 112110-1 through 112110-4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 113104-3.
"Single-shot read-out of an individual electron spin in a quantum dot," Elzerman et al., Nature, vol. 430, Jul. 22, 2004, pp. 431-435.
"An addressable quantum dot qubit with fault-tolerant control-fidelity," Veldhorst et al., Nature Nanotechnology vol. 9, Dec. 2014, pp. 981-985.

\* cited by examiner

QUANTUM CIRCUIT ASSEMBLY WITH A DIGITAL-TO-ANALOG CONVERTER AND AN ARRAY OF ANALOG MEMORY CELLS

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which may help minimize qubit decoherence. Another challenge resides in performing qubit operations such as initialization, readout, single-qubit gate operations, and two-qubit gate operations in a manner that is reliable, high fidelity, and uses electronics which would be feasible on implement on the large scale.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
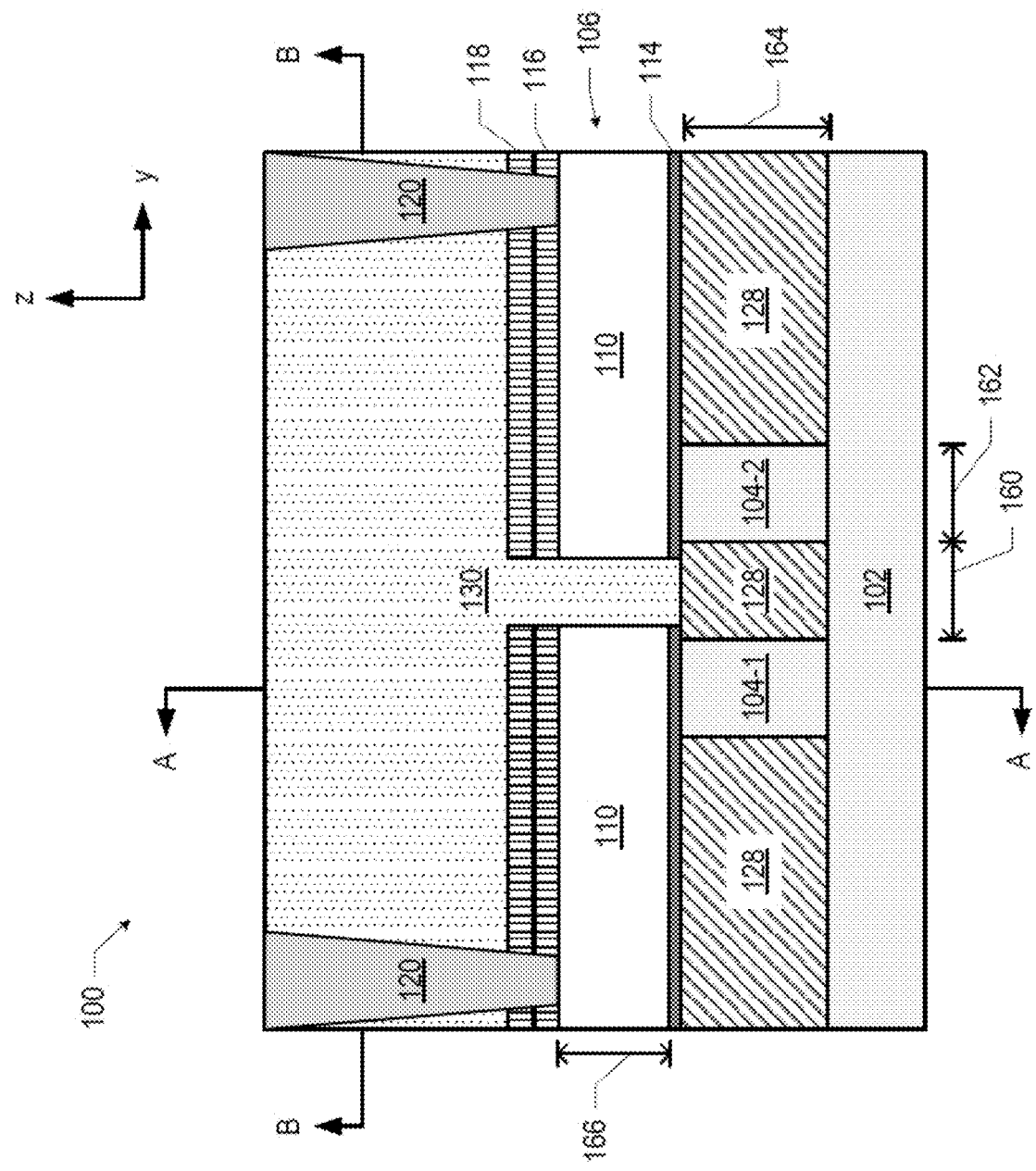
FIGS. 1-3 are cross-sectional views of an example device implementing quantum dot qubits, according to some embodiments of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. So for example, two entangled qubits may be represented by a superposition of 4 quantum states, and N entangled qubits may be represented by a superposition of $2^n$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e. by trying to ascertain anything about the particles, we collapse their state) and collapse to one of the $2^n$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^n$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics). Furthermore, as briefly described above, for the reason of protecting fragile qubits from decoherence, they are often operated at cryogenic temperatures by being placed in a suitable cooling apparatus, e.g., a dilution refrigerator. This raises further challenges in providing various signals to qubit devices which must be kept at such low temperatures.

None of the challenges described above ever had to be addressed for classical computers, and these challenges are not easy. In particular, providing control signals to a quantum circuit component to perform logic operations on the plurality of qubit devices (or, simply, qubits) included therein in the short time before the qubits decohere is far from trivial, further complicated by the qubits being operated within a cooling apparatus. For example, a quantum-dot spin qubit typically has, or is associated with, a plurality of gates (e.g., barrier, plunger, and accumulation gates) used to perform operations on the qubit. The operations (e.g., qubit initialization, qubit readout, single-qubit gate operations, and multi-qubit gate operations) may be realized by applying electrical direct current (DC) signals, e.g. DC pulses, to various ones of these gates, which may be performed in combination with magnetic resonance technique. Such DC pulses may be provided by DACs which convert digital input to analog DC signals, e.g., DC voltage pulses. In order to achieve a high fidelity and a reliable operation, the required amplitude resolution of DACs is very high, e.g., 18-bit resolution. Moreover, for certain qubit operations such as readout and two-qubit gate operations, the DACs need to be high-speed DACs, e.g., operating at frequencies greater than 600 megahertz (MHz). In a testing laboratory environment, conventionally, a dedicated DAC is used to provide DC pulses to a single gate. Since there are typically many gates, many DACs need to be employed in parallel. For example, n quantum dot spin qubits may include 2n+1 of barrier and plunger gates, where n is an integer at least equal to, but typically greater than, 1. Using that many high-resolution high-speed DACs (e.g., DACs with 18-bit amplitude resolution and 600 MHz bandwidth) to support n qubits poses a tremendous challenge to scaling quantum circuit components to include more than about 10 qubits and make it just about impractical to include more than 100 qubits.

Embodiments of the present disclosure describe quantum circuit assemblies that allow reducing the number of DACs used to perform qubit operations such as initialization, readout, single-qubit gate operations, and two-qubit gate operations. An example quantum circuit assembly includes a quantum circuit component that includes a plurality of qubit devices operable by selectively applying control signals, e.g., direct current (DC) signals (e.g., analog voltages), to a plurality of terminals (e.g., gates) of the plurality of qubit devices, an array of analog memory cells, and a DAC configured to sequentially generate analog values/signals (e.g., analog voltages) to be stored in different ones of the analog memory cells (i.e., each analog value is stored in a respective analog memory cell). The assembly further includes a switching arrangement configured to, during operation of the quantum circuit component, selectively apply control signals to the plurality of terminals of the plurality of qubit devices, where each control signal is applied by the switching arrangement electrically connecting an output terminal of a different analog memory cell of the array of analog memory cells to one of the plurality of terminals of the plurality of qubit devices. Performing digital-to-analog conversion ahead of performing qubit operations and storing results of the conversion in different analog memory cells allows pre-generating and storing analog voltages required for at least some, or all, of the qubit operations that may be carried out during the qubit coherence time. Qubit operations may then be performed by applying control signals to different qubit terminals, where a control signal applied to a given terminal at a given time is based on (i.e., is indicative of, or depends on) the analog value that was stored in the analog memory cell that has an output terminal connected, by the switching arrangement, to said terminal. In other words, qubit operations may be performed by applying control signals based on the content of analog memory cells, instead of based directly on the output of parallel DACs, thereby allowing the total number of DACs used to operate a given number of qubits to be significantly reduced. This, in turn, may not only provide substantial cost savings and make scaling of qubits to large numbers possible, but also reduce power consumption, reduce the size of the final package, reduce heat dissipation problems, reduce clock synchronization problems associated with running multiple DACs, offer a very high speed, and so on. Thus, providing quantum circuit assemblies that include a DAC configured to pre-generate analog values for performing qubit operations and a plurality of analog memory cells configured to store the pre-generated analog values, as described herein, may enable performing qubit operations in a manner that is reliable, high fidelity, and uses electronics which would be feasible on implement on the large scale.

In some embodiments, all required analog voltages for all qubit operations may be pre-generated before starting qubit operations. In some such embodiments, no further analog voltages are generated in the middle of qubit operations (e.g., during the coherence time of the qubits) as that could result in idle time. In such embodiments, the number of analog memory cells may be equal to, at least, the number of qubit terminals multiplied by the number of required analog voltages per gate for the entire qubit operation time (qubit coherence time).

In various embodiments, quantum circuit assemblies that include a DAC configured to pre-generate analog values for performing qubit operations and a plurality of analog memory cells configured to store the pre-generated analog values, as described herein, may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

Some descriptions are provided with reference to quantum dot qubits, a particular class of spin qubits. However, at least some teachings of the present disclosure may be applicable to implementations of quantum circuit components with any qubits, e.g., including spin qubits other than quantum dot qubits, and/or including qubits other than spin qubits, which may be integrated within an assembly that includes a DAC configured to pre-generate analog values for performing qubit operations and a plurality of analog memory cells configured to store the pre-generated analog values, as described herein, all of which implementations being within the scope of the present disclosure. Furthermore, in some embodiments, the quantum circuit components described herein may implement hybrid quantum circuits (e.g., qubits of different types).

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, while the present disclosure may include references to microwave signals, this is done only because current qubits are designed to work with such signals because the energy in the microwave range of the RF spectrum is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Example Quantum Circuit Components with Quantum Dot Qubits

As described above, the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. semiconducting qubits including those made using quantum dots (e.g., spin qubits and charge qubits), superconducting qubits (e.g. flux qubits or transmon qubits, the latter sometimes simply referred to as "transmons"), photon polarization qubits, single trapped ion qubits, etc. To indicate that these devices implement qubits, sometimes these devices are referred to as qubits, e.g. quantum dot qubits, superconducting qubits, etc.

The type of qubits used in a quantum circuit component would affect what types of control signals are to be provided to the qubits to perform qubit operations. Below, one example of quantum circuit components is described, namely, the one incorporating quantum dot qubits, as illustrated with reference to FIGS. 1-13. However, quantum circuit assemblies that include a DAC configured to pre-generate analog values for performing qubit operations and a plurality of analog memory cells configured to store the pre-generated analog values, as described herein, may include quantum circuit components that include any type of qubits, or different types of qubits, all of which being within the scope of the present disclosure.

Quantum dot devices may enable the formation of quantum dots to serve as quantum bits (i.e. as qubits) in a quantum computing device. One type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this is the type of a qubit device that is described as an example qubit device that may be used in a quantum circuit component to be integrated in a quantum circuit assembly that includes a DAC configured to pre-generate analog values for performing qubit operations and a plurality of analog memory cells configured to store the pre-generated analog values as described herein, according to some embodiments of the present disclosure.

Figure 2:
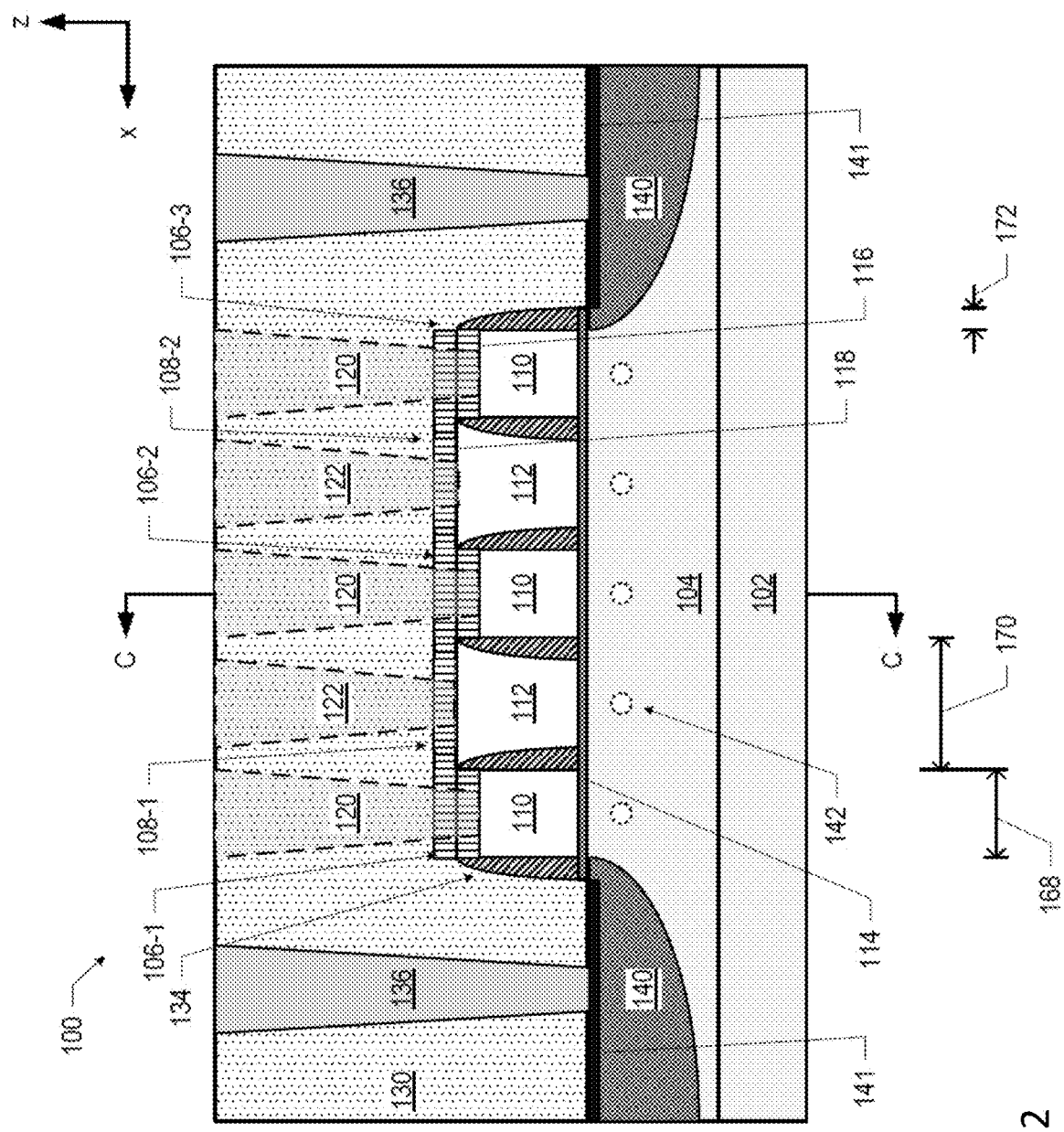
Figure 3:
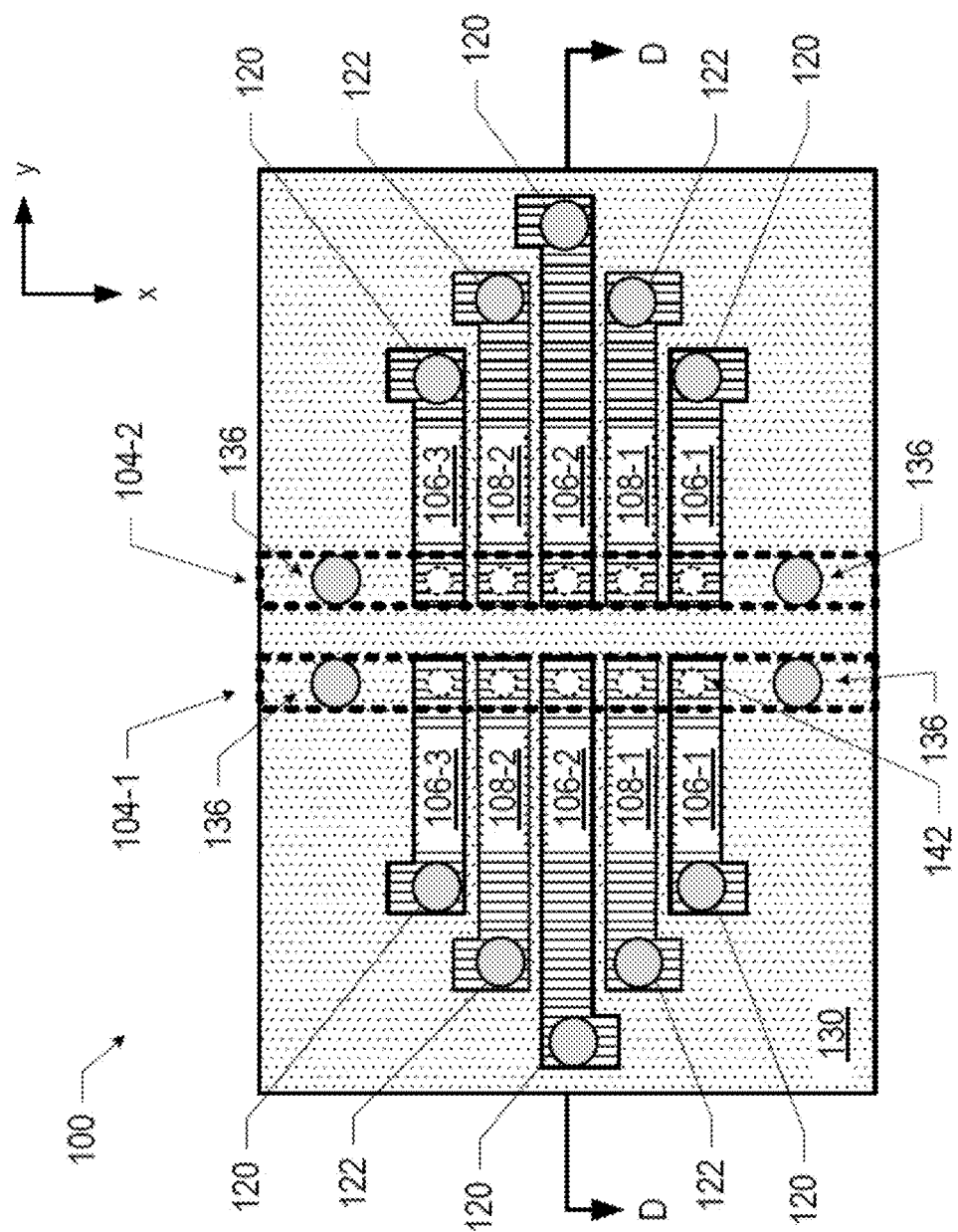

FIGS. 1-3 are cross-sectional views of an example quantum dot device 100 implementing quantum dot qubits, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 (while FIG. 1 illustrates a quantum dot device 100 taken along the section D-D of FIG. 3). Although FIG. 1 indicates that the cross-section illustrated in FIG. 2 is taken through the fin 104-1, an analogous cross-section taken through the fin 104-2 may be identical, and thus the discussion of FIGS. 1-3 refers generally to the "fin 104."

A quantum circuit component to be operated and/or tested within a quantum circuit assembly that includes a DAC configured to pre-generate analog values for performing qubit operations and a plurality of analog memory cells configured to store the pre-generated analog values, as described herein, may include one or more of the quantum dot devices 100.

As shown in FIGS. 1-3, the quantum dot device 100 may include a base 102 and multiple fins 104 extending away from the base 102. The base 102 and the fins 104 may include a semiconductor substrate and a quantum well stack (not shown in FIGS. 1-3, but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer of the quantum well stack (discussed below with reference to the quantum well layer 152 of FIGS. 4-6). Examples of base/fin arrangements are discussed below with reference to the base fin arrangements 158 of FIGS. 7-13.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 microns.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, multiple groups of gates like the gates illustrated in FIG. 2 may be disposed on the fin 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114. In the embodiment illustrated in FIG. 2, the gate dielectric 114 for all of the gates 106/108 is provided by a common layer of gate dielectric material. In other embodiments, the gate dielectric 114 for each of the gates 106/108 may be provided by separate portions of gate dielectric 114. In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 2, the hardmask 118 may extend over the hardmask 116 (and over the gate metal 110 of the gates 106), while in other embodiments, the hardmask 118 may not extend over the gate metal 110 (e.g., as discussed below). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108 may extend between the proximate spacers 134 on the sides of the gate 106-1 and the gate 106-3, as shown in FIG. 2. In some embodiments, the gate metal 112 may extend between the spacers 134 on the sides of the gate 106-1 and the gate 106-3. Thus, the gate metal 112 may have a shape that is substantially complementary to the shape of the spacers 134, as shown. In some embodiments in which the gate dielectric 114 is not a layer shared commonly between the gates 108 and 106, but instead is separately deposited on the fin 104 between the spacers 134 (e.g., as discussed below), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIG. 2, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130.

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104, forming what may be referred to as a "quantum dot array." The location of the quantum dots 142 in FIG. 2 is not intended to indicate a particular geometric positioning of the quantum dots 142. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable material; for example, in embodiments in which the doped region 140 includes silicon, the interface material 141 may include nickel silicide.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, and/or silicon oxynitride. As known in the art of IC manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

Although not specifically shown in FIGS. 1-3, the quantum dot device 100 may further include one or more accumulation gates used to form a 2DEG in the quantum well area between the area with the quantum dots and the reservoir such as e.g. the doped regions 140 which, as previously described, may serve as a reservoir of charge carriers for the quantum dot device 100. Using such accumulation gates may allow to reduce the number of charge carriers in the area adjacent to the area in which quantum dots are to be formed, so that single charge carriers can be transferred from the reservoir into the quantum dot array. In various embodiments, an accumulation gate may be implemented on either side of an area where a quantum dot is to be formed.

Although also not specifically shown in FIGS. 1-3, some implementations of the quantum dot device 100 further include or are coupled to a magnetic field source used for spin manipulation of the charge carriers in the quantum dots. In various embodiments, e.g. a microwave transmission line or one or more magnets with pulsed gates may be used as a magnetic field source. Once a quantum dot array is initialized by ensuring that a desired number of charge carriers are present in each quantum dot and ensuring the initial spins of these charge carriers, spin manipulation may be carried out with either a single spin or pairs of spin or possibly larger numbers of spins. In some embodiments, single spins may be manipulated using electron spin resonance with a rotating magnetic field (perpendicular to its static field) and on resonance with the transition energy at which the spin flips.

Figure 4:
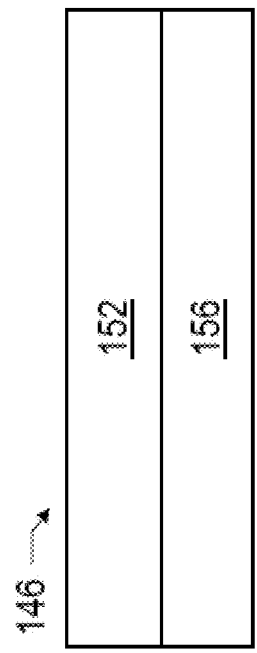
FIGS. 4-6 are cross-sectional views of various examples of quantum well stacks that may be used in a quantum dot device, according to some embodiments of the present disclosure.
Figure 5:
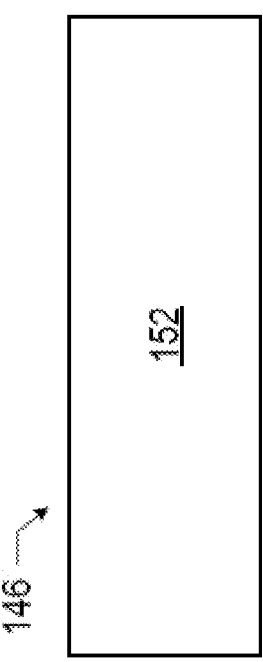
Figure 6:
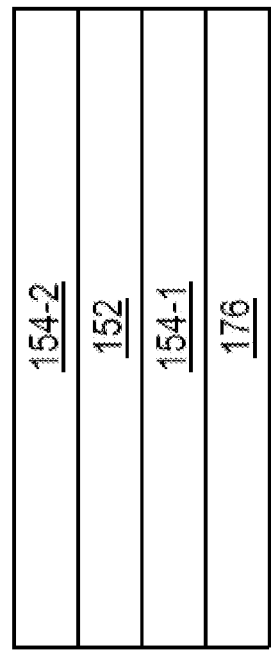

As discussed above, the base 102 and the fin 104 of a quantum dot device 100 may be formed from a semiconductor substrate 144 and a quantum well stack 146 disposed on the semiconductor substrate 144. The quantum well stack 146 may include a quantum well layer in which a 2DEG may form during operation of the quantum dot device 100. The quantum well stack 146 may take any of a number of forms, several of which are illustrated in FIGS. 4-6. The various layers in the quantum well stacks 146 discussed below may be grown on the semiconductor substrate 144 (e.g., using epitaxial processes).

FIG. 4 is a cross-sectional view of a quantum well stack 146 including only a quantum well layer 152. The quantum well layer 152 may be disposed on the semiconductor substrate 144, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 4 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. In some such embodiments, the intrinsic silicon may be strained, while in other embodiments, the intrinsic silicon may not be strained. The thicknesses (i.e., z-heights) of the layers in the quantum well stack 146 of FIG. 4 may take any suitable values. For example, in some embodiments, the thickness of the quantum well layer 152 (e.g., intrinsic silicon) may be between 0.8 and 1.2 microns.

FIG. 5 is a cross-sectional view of a quantum well stack 146 including a quantum well layer 152 and a barrier layer 154. The quantum well stack 146 may be disposed on a semiconductor substrate 144 such that the barrier layer 154 is disposed between the quantum well layer 152 and the semiconductor substrate 144. The barrier layer 154 may provide a potential barrier between the quantum well layer 152 and the semiconductor substrate 144. As discussed above with reference to FIG. 4, the quantum well layer 152 of FIG. 5 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 5 may be formed of silicon, and the barrier layer 154 may be formed of silicon germanium. The germanium content of this silicon germanium may be 20-80% (e.g., 30%). The thicknesses (i.e., z-heights) of the layers in the quantum well stack 146 of FIG. 5 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon) may be between 5 and 30 nanometers.

FIG. 6 is a cross-sectional view of a quantum well stack 146 including a quantum well layer 152 and a barrier layer 154-1, as well as a buffer layer 176 and an additional barrier layer 154-2. The quantum well stack 146 may be disposed on the semiconductor substrate 144 such that the buffer layer 176 is disposed between the barrier layer 154-1 and the semiconductor substrate 144. The buffer layer 176 may be formed of the same material as the barrier layer 154, and may be present to trap defects that form in this material as it is grown on the semiconductor substrate 144. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The thicknesses (i.e., z-heights) of the layers in the quantum well stack 146 of FIG. 6 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 154-1 (e.g., silicon germanium) may be between 0 and 400 nanometers. In some embodiments, the thickness of the quantum well layer 152 (e.g., silicon) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 6 may be formed of silicon, and the barrier layer 154-1 and the buffer layer 176 may be formed of silicon germanium. In some such embodiments, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1, but may be thicker than the barrier layer 154-1 so as to absorb the defects that may arise during growth. The barrier layer 154-2, like the barrier layer 154-1, may provide a potential energy barrier around the quantum well layer 152, and may take the form of any of the embodiments of the barrier layer 154-1. In some embodiments of the quantum well stack 146 of FIG. 6, the buffer layer 176 and/or the barrier layer 154-2 may be omitted.

The semiconductor substrate 144 and the quantum well stack 146 may be distributed between the base 102 and the fins 104 of the quantum dot device 100, as discussed above. This distribution may occur in any of a number of ways. For example, FIGS. 7-13 illustrate example base/fin arrangements 158 that may be used in a quantum dot device 100, in accordance with various embodiments.

Figure 7:
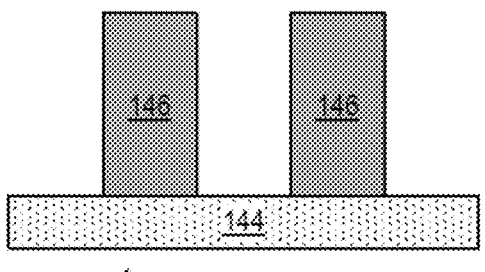
FIGS. 7-13 illustrate example base/fin arrangements that may be used in a quantum dot device, according to some embodiments of the present disclosure.

In the base/fin arrangement 158 of FIG. 7, the quantum well stack 146 may be included in the fins 104, but not in the base 102. The semiconductor substrate 144 may be included in the base 102, but not in the fins 104. Manufacturing of the base/fin arrangement 158 of FIG. 7 may include fin etching through the quantum well stack 146, stopping when the semiconductor substrate 144 is reached.

Figure 8:
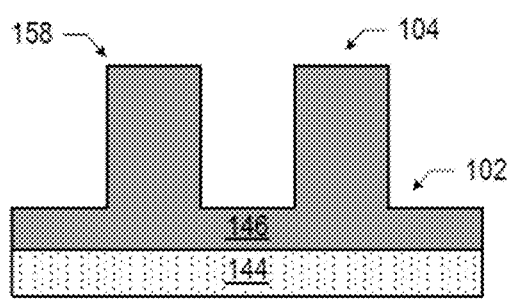
Figure 9:
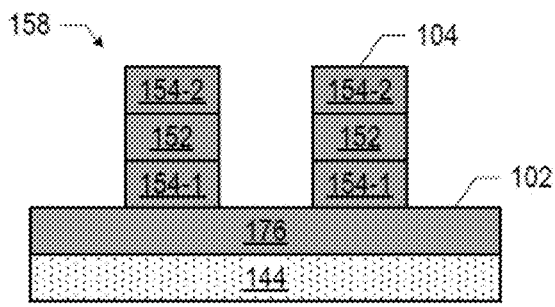

In the base/fin arrangement 158 of FIG. 8, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 8 may include fin etching that etches partially through the quantum well stack 146, and stops before the semiconductor substrate 144 is reached. FIG. 9 illustrates a particular embodiment of the base/fin arrangement 158 of FIG. 8. In the embodiment of FIG. 9, the quantum well stack 146 of FIG. 6 is used; the fins 104 include the barrier layer 154-1, the quantum well layer 152, and the barrier layer 154-2, while the base 102 includes the buffer layer 176 and the semiconductor substrate 144.

Figure 10:
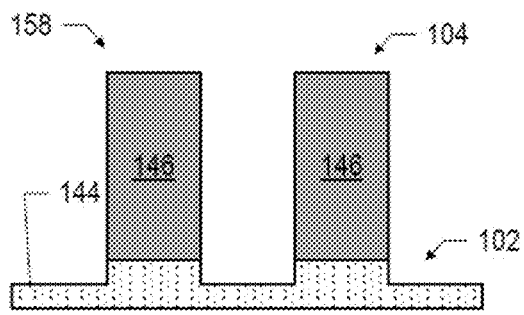
Figure 11:
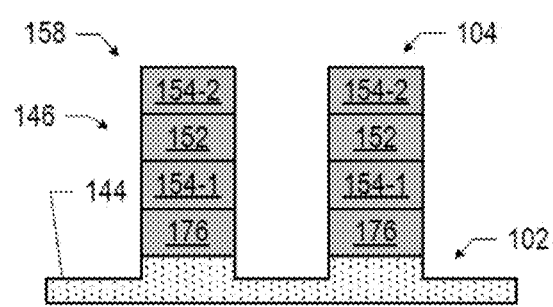

In the base/fin arrangement 158 of FIG. 10, the quantum well stack 146 may be included in the fins 104, but not the base 102. The semiconductor substrate 144 may be partially included in the fins 104, as well as in the base 102. Manufacturing the base/fin arrangement 158 of FIG. 10 may include fin etching that etches through the quantum well stack 146 and into the semiconductor substrate 144 before stopping. FIG. 11 illustrates a particular embodiment of the base/fin arrangement 158 of FIG. 10. In the embodiment of FIG. 11, the quantum well stack 146 of FIG. 6 is used; the fins 104 include the quantum well stack 146 and a portion of the semiconductor substrate 144, while the base 102 includes the remainder of the semiconductor substrate 144.

Figure 12:
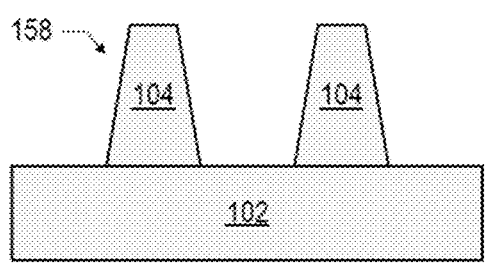
Figure 13:
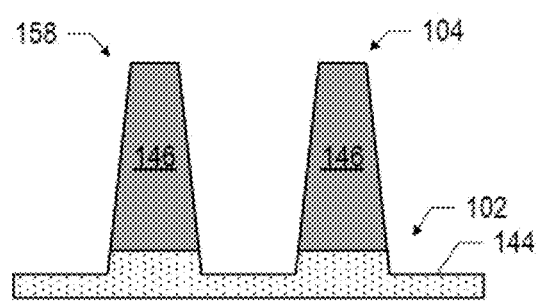

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 12, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 12. FIG. 13 illustrates a particular embodiment of the base/fin arrangement 158 of FIG. 12. In FIG. 13, the quantum well stack 146 is included in the tapered fins 104 while a portion of the semiconductor substrate 144 is included in the tapered fins and a portion of the semiconductor substrate 144 provides the base 102.

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

Including a DAC and Analog Memory Cells in Quantum Circuit Assemblies

Figure 14:
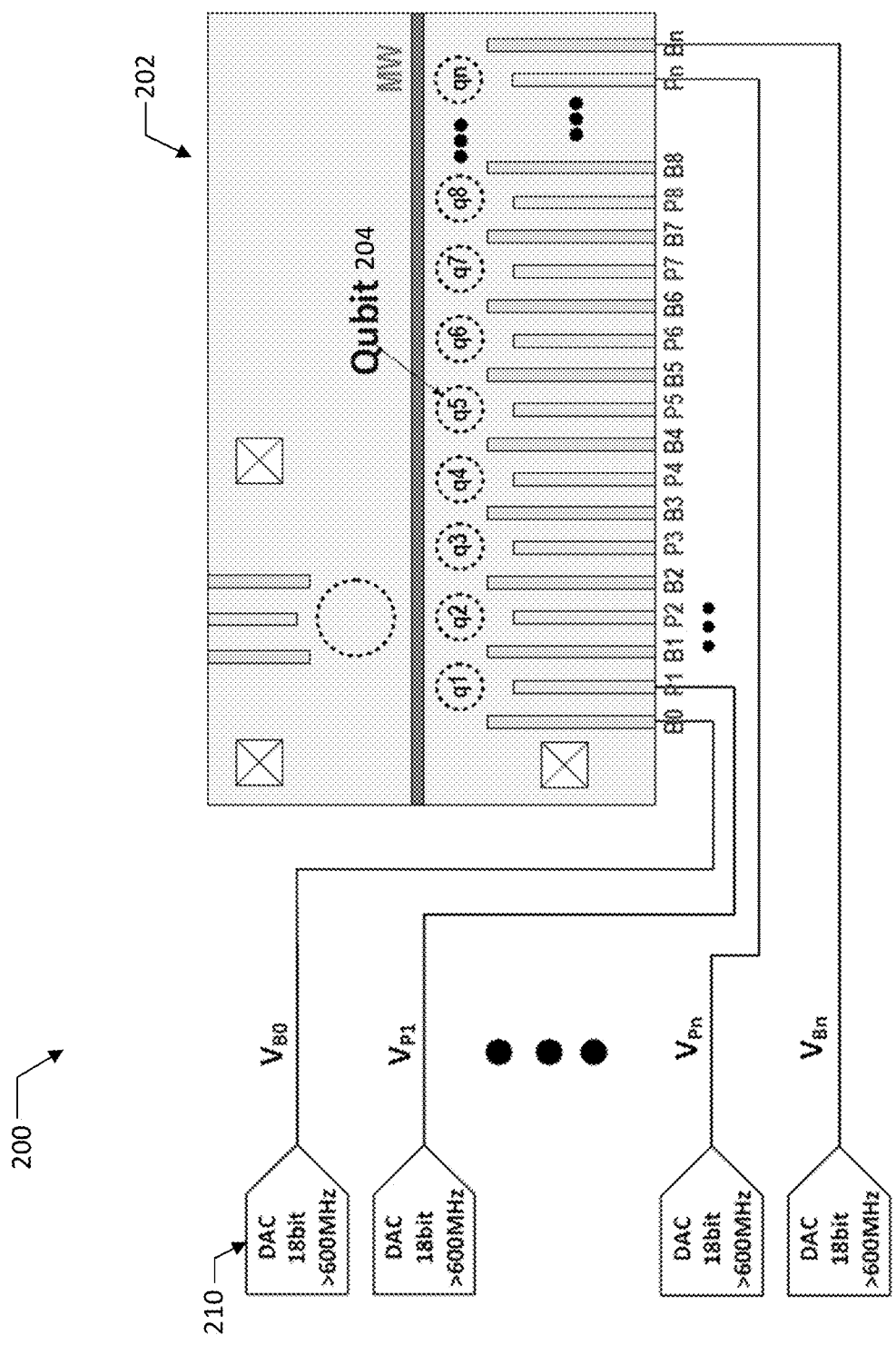
FIG. 14 provides a schematic illustration of an example quantum circuit assembly with a quantum circuit component with n quantum dot qubits and a plurality of digital-to-analog converters (DACs).

As the foregoing description illustrates, during operation of a quantum circuit component, various control signals may be applied to various terminals (e.g., gates) of qubits. In conventional implementations, an individual DAC is used for each of the gates. Furthermore, since multiple control signals often need to be applied to a single gate during qubit operation in the time before the qubits decohere, such DACs may need to be high-speed DACs. An example setting of such a conventional implementation is shown in FIG. 14, providing a schematic illustration of an example quantum circuit assembly 200 with a quantum circuit component 202 with n quantum dot qubits 204 (labeled in FIG. 14 as qubit q1, q2, . . . , qn), and a plurality of DACs 210. FIG. 14 illustrates that, in some embodiments, n quantum dot qubits may include 2n+1 gates because each quantum dot qubit may include a plunger gate between a pair of barrier gates. If an individual DAC is used for each gate, then such embodiments would require 2n+1 DACs 210 (only one of the DACs is labeled in FIG. 14 with the reference numeral "210" in order to not clutter the drawing). Plunger gates are labeled in FIG. 14 as gates P1, P2, . . . , Pn (thus, a total of n plunger gates), while barrier gates are labeled in FIG. 14 as gates B0, B1, . . . , Bn (thus, a total of n+1 barrier gates). Signals provided from the DACs 210 to the respective barrier or plunger gates are labeled in FIG. 14 as V (because the signal may be a voltage signal) with a subscript of the respective gate. For example, the first DAC 210 is shown in FIG. 14 to provide the signal $V_{B0}$ to the barrier gate B0, the second DAC 210 is shown to provide the signal $V_{P1}$ to the plunger gate P1, and so on.

Figure 15:
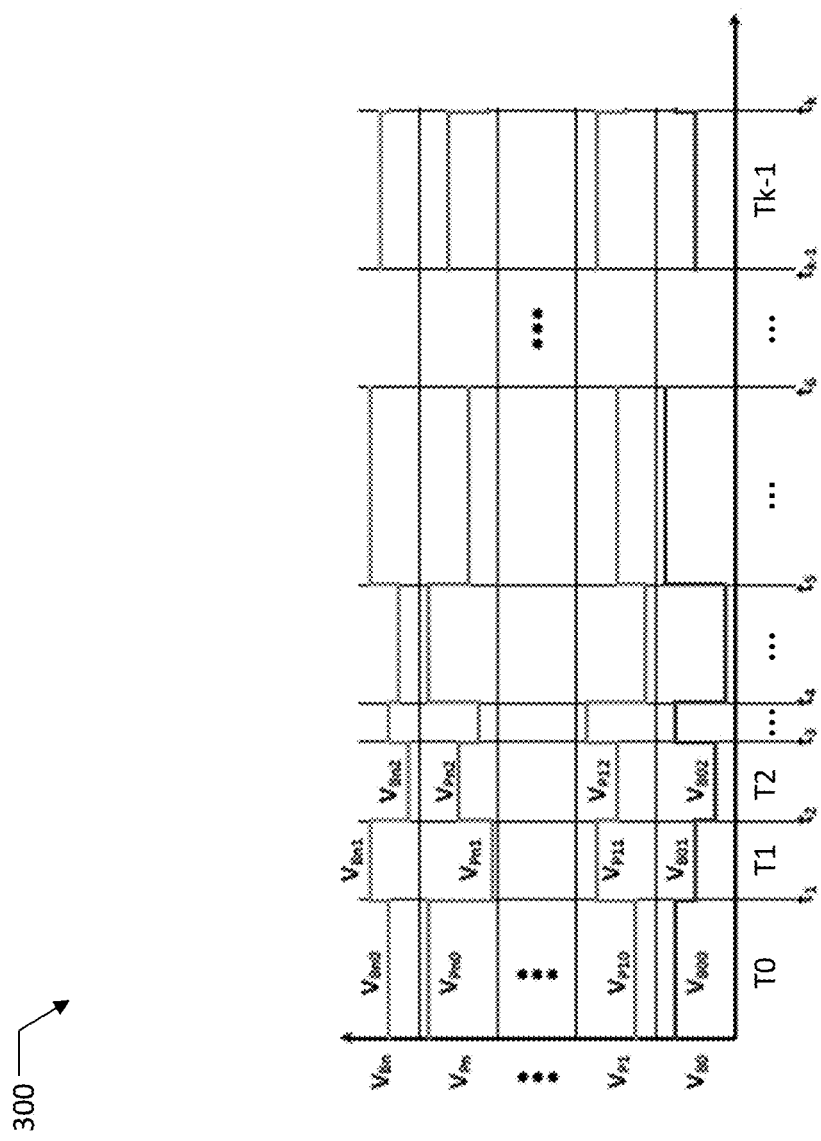
FIG. 15 provides a schematic illustration of an example timing diagram for providing control signals to a quantum circuit component with n quantum dot qubits, according to some embodiments of the present disclosure.

During operation of a quantum circuit assembly in the time before the qubits decohere, a given gate may receive different signals at different times. This is illustrated in FIG. 15, providing a schematic illustration of an example timing diagram 300 for providing control signals to a quantum circuit component with n quantum dot qubits, according to some embodiments of the present disclosure. In particular, continuing with the notation of n quantum dot qubits with n plunger gates and n+1 barrier gates as described with reference to FIG. 14, FIG. 15 illustrates how each of the 2n+1 gates may receive different DC signals (e.g., DC voltages) at different times. For example, as shown in FIG. 15, in the time period T0 (which is the time between the beginning of the operation of the quantum circuit assembly and time t1), the barrier gate B0 may receive a signal $V_{B00}$ from the first DAC 210, the plunger gate P1 may receive a signal $V_{P10}$ from the second DAC 210, and so on for the rest of the barrier and plunger gates. Next, as also shown in FIG. 15, in the time period T1 (which is the time between time t1 and time t2), the barrier gate B0 may receive a signal $V_{B01}$ from the first DAC 210, the plunger gate P1 may receive a signal $V_{P11}$ from the second DAC 210, and so on for the rest of the barrier and plunger gates. After that, as further shown in FIG. 15, in the time period T2 (which is the time between time t2 and time t3), the barrier gate B0 may receive a signal $V_{B02}$ from the first DAC 210, the plunger gate P1 may receive a signal $V_{P12}$ from the second DAC 210, and so on for the rest of the barrier and plunger gates. A sum of the time periods T0, T1, . . . , and Tk−1 may be considered to be about equal to the coherence time of the qubits. Thus, FIG. 15 illustrates how a single gate may receive a plurality of signals during qubit operation for the duration of the coherence time, which may require the DACs 210 to be sufficiently high-speed to be able to supply such plurality of signals.

As the foregoing description illustrates, when each DAC 210 is to be a high-resolution (e.g., 18-bit), high-speed DAC, implementing 2n+1 DACs 210 to support n qubits 204 quickly becomes prohibitively expensive for scaling up the number of qubits. Various embodiments of the present disclosure provide a solution that may improve on this problem by sharing at least one DAC used in a quantum circuit assembly between at least two different terminals (e.g., gates) of a plurality of qubits (e.g., by using at least one DAC to provide control signals to at least two different terminals during a set of qubit operations during a given qubit coherence time), and/or by using at least one DAC to pre-generate multiple analog values from which control signals for at least two different time periods (e.g., the time periods T0 and T1, described above) may be generated. These embodiments will now be described with reference to FIGS. 16 and 17.

Figure 16:
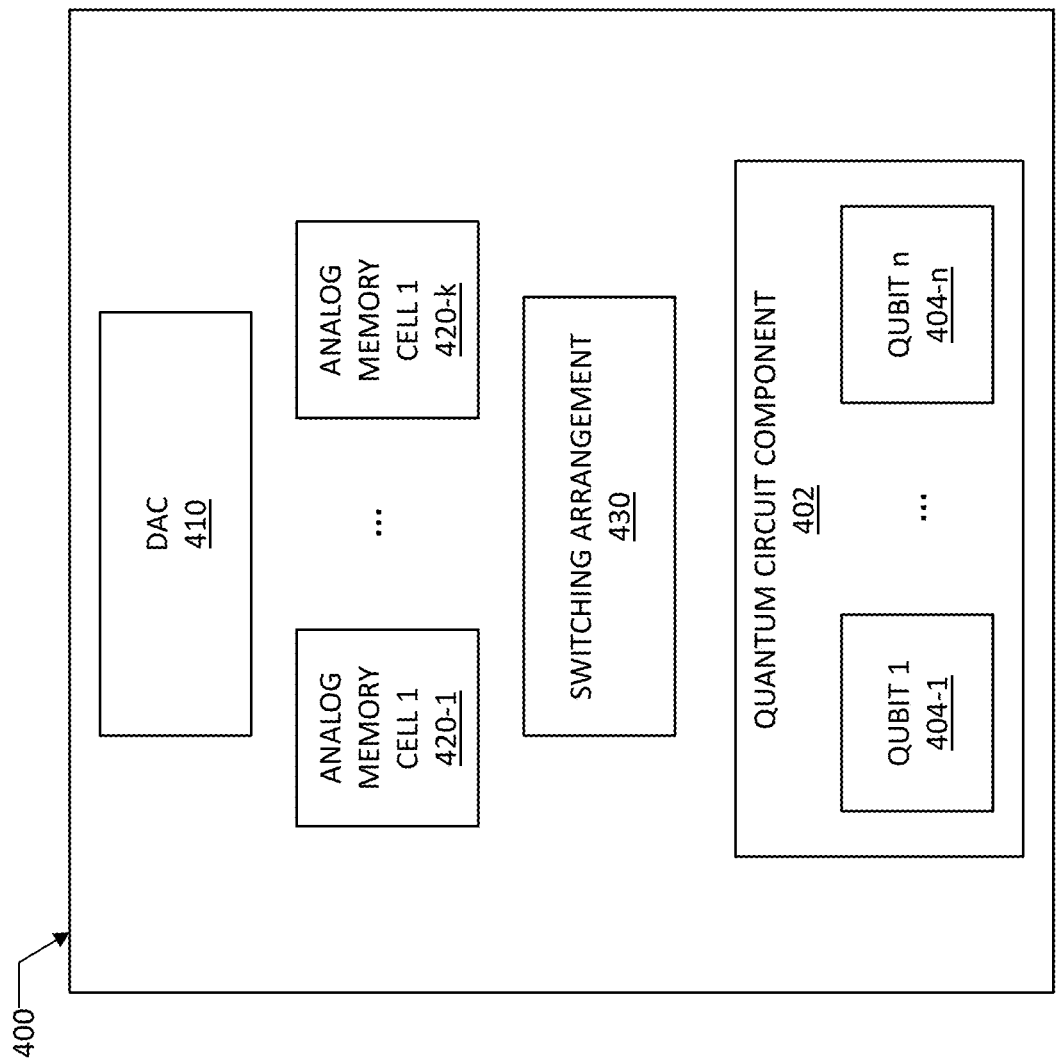
FIG. 16 provides a schematic illustration of a quantum circuit assembly with a DAC configured to pre-generate analog values for performing qubit operations, and a plurality of analog memory cells configured to store the pre-generated analog values, according to some embodiments of the present disclosure.

FIG. 16 provides a schematic illustration of a quantum circuit assembly 400 according to some embodiments of the present disclosure. As shown in FIG. 16, the quantum circuit assembly 400 may include a quantum circuit component 402 that includes a plurality of qubit devices 404, shown as qubit 1 labeled with a reference numeral "404-1" through qubit n labeled with a reference numeral "404-n," where n is an integer equal to or greater than 1. As also shown in FIG. 16, the quantum circuit assembly 400 may further include a DAC 410, a switching arrangement 430, and a plurality of analog memory cells 420, shown as analog memory cell 1 labeled with a reference numeral "420-1" through analog memory cell k labeled with a reference numeral "420-k," where k is an integer greater than 1. In some embodiments, one or more of the analog memory cells 420, the DAC 410, and the switching arrangement 430 may be integrated on a single substrate with the quantum circuit component 402.

The quantum circuit component 402 may include a die with any combination of one or more qubit devices 404, e.g. any one or more of the quantum dot qubits as described above. In general, the term "die" refers to a small block of semiconductor material/substrate on which a particular functional circuit is fabricated. On the other hand, an IC chip, also referred to as simply a chip or a microchip, sometimes refers to a semiconductor wafer on which thousands or millions of such devices or dies are fabricated. However, other times, an IC chip refers to a portion of a semiconductor wafer (e.g. after the wafer has been diced) containing one or more dies, or the terms "chip" and "die" are used interchangeably. The quantum circuit component 402 may be any component that includes one or more, typically a plurality, of qubits which may be used to perform quantum processing operations. For example, the qubits 404 of the quantum circuit component 402 may be quantum dot devices 100 as described above. In another example, the quantum circuit component 402 may be implemented as the quantum circuit component 202, where the qubits 404 may be implemented as the qubits 204, described above. However, in general, the quantum circuit component 402 may include any type of qubits 404, all of which are within the scope of the present disclosure. In some embodiments, the quantum circuit component 402 may be included in the quantum circuit assembly 400 as a part of a quantum processing device, e.g., a part of a quantum processing device 2026 described with reference to FIG. 20. In other words, in some embodiments, the quantum circuit component 402 included in the quantum circuit assembly 400 may be a quantum processing device that may include one or more further components besides qubit devices, e.g., any one or more of the components of the quantum processing device 2026 described with reference to FIG. 20.

Although not specifically shown in FIG. 16, the qubits 404 may include a plurality of terminals, e.g., barrier gate terminals (or simply "barrier gates"), plunger gate terminals (or simply "plunger gates"), and/or accumulation gate terminals (or simply "accumulation gates"), as described above. For example, the qubits 404 may be quantum dot qubits as described above, and may include the gates 106/108 to which voltages may be applied to perform qubit operations. In a further example, the qubits 404 may include an arrangement of barrier and plunger gates as described with reference to FIG. 14.

The qubits 404 may be operable by selectively applying control signals (e.g., DC voltage signals, e.g., DC voltage pulses) to a plurality of terminals (e.g., barrier and plunger gate terminals) of the qubits 404. For example, control signals as described with reference to FIG. 15 may be applied to various terminals of the qubits 404, at various times, to perform qubit operations during the qubit coherence time, as described with reference to FIG. 15. In one example embodiment where the qubits 404 are quantum dot qubits, at least one quantum dot qubit 404 may include a plunger gate terminal as one of the plurality of terminals of the qubits 404, and selectively applying control signals to the plurality of terminals of the qubits 404 may include applying a plunger gate voltage to the plunger gate terminal of said quantum dot qubit 404 to control formation of one or more quantum dots in said one quantum dot qubit 404. In another example embodiment where the qubits 404 are quantum dot qubits, each of at least two quantum dot qubits 404 may include a plunger gate terminal and a barrier gate terminal as some of the plurality of terminals of the qubits 404, and selectively applying control signals to the plurality of terminals of the qubits 404 may include applying a barrier gate voltage to at least one barrier gate terminal of these two quantum dot qubits 404 to control a potential barrier between the plunger gate terminals of the two quantum dot qubits 404, e.g., for a two-qubit gate operation/entanglement.

In contrast to conventional implementations where parallel DACs are used to provide control signals to each of the gates, the quantum circuit assembly 400 includes the DAC 410 that is configured to sequentially generate a plurality of analog values, which are to be stored in different ones of the analog memory cells 420. For example, the DAC 410 may be used to generate analog values based on which two or more of the control signals $V_{B00}, V_{B01}, \ldots, V_{P10}, V_{P11}$, and so on, described with reference to FIG. 15, may be provided. In some embodiments, the analog values generated by the DAC 410 may be stored in the different ones of the analog memory cells 420 by storing in the cells 420 electric charges indicative of the analog values. The switching arrangement 430 may then be configured to, during operation of the quantum circuit component 402, selectively apply control signals to the terminals of the qubits 404, where at least some of the control signals are applied by the switching arrangement 430 electrically connecting an output terminal of a different analog memory cell 420 of the array of analog memory cells to one of the terminals of the qubits 404. In this manner, a control signal applied to a given terminal of the qubits 404, at a given time, may be based on (i.e., is indicative of, or depends on) the analog value that was stored in one of the analog memory cells 420 that has an output terminal connected, by the switching arrangement 430, to said terminal. In some embodiments, electrically connecting the output terminal of a given analog memory cell 420 to the one of the plurality of terminals of the qubits 404 may be configured to transfer an electrical charge indicative of the analog value stored in the analog memory cell 420 to the corresponding one of the plurality of terminals of the qubits 404, thereby applying an analog voltage to the terminal.

In some embodiments, the DAC 410 may be configured to pre-generate all analog values needed for applying control signals to perform all qubit operations during a given qubit coherence time so that no further analog values/voltages need to be generated in the middle of qubit operations, and each of these analog values are then stored in a respective analog memory cell 420, e.g., before qubit operation. If only one DAC 410 is used, then the DAC 410 may generate these values sequentially ahead of time. In other embodiments, multiple DACs similar to the DAC 410 may be used to generate their respective sub-sets of the analog values, e.g., so that, together, all of such DACs pre-generate all analog values needed for applying control signals to perform all qubit operations during a given qubit coherence time, and each of these analog values are then stored in a respective analog memory cell 420. Such embodiments may be advantageous in terms of still decreasing the requirements on each individual DAC (in terms of resolution and/or speed), compared to conventional implementations, while also providing the advantage of being able to generate the required analog values quicker because at least some of such DACs may perform their conversions in parallel. In such embodiments, the number k of analog memory cells 420 may be equal to, at least, the number of qubit terminals multiplied by the number of required analog voltages per gate for the entire qubit coherence time.

In other embodiments, the DAC 410 may be configured to pre-generate a subset (i.e., not all) of analog values needed for applying control signals to perform all qubit operations during a given qubit coherence time, and each of these analog values are then stored in a respective analog memory cell 420. In such embodiments, additional analog values/voltages may be generated in the middle of qubit operations. For example, in some such embodiments, the DAC 410 may be configured to pre-generate analog values. Subsequently, control signals for two or more different gates, or control signals for a single gate but for two or more different time periods (e.g., time period T0 and time period T1, shown in FIG. 15) may be generated based on the analog values generated by the DAC 410.

It should be noted that the switching arrangement 430 may be such that it may apply one control signal to one gate and apply another control signal to another gate of the quantum circuit component 402 simultaneously, or in some time-overlapping manner (i.e., a time when the switching arrangement 430 applies a control signal to a first gate may at least partially overlap with a time when the switching arrangement 430 applies a control signal to a second gate).

As described above, applying control signals (e.g., analog voltages, e.g., DC voltages or DC voltage pulses) to various gates of the quantum circuit component 402, at least some of which control signals are based on the analog values stored in the analog memory cells 420, allows performing one or more qubit operations. The control signals may, e.g., be plunger voltages, barrier voltages, and/or accumulation voltages as described above. Examples of such operations may include one or more of an initialization of at least one of the qubits 404, a readout of at least one of the qubits 404, a single-gate qubit operation using at least one of the qubits 404, and a multi-gate (e.g., two-gate) qubit operation using at least one of qubits 404.

Figure 17A:
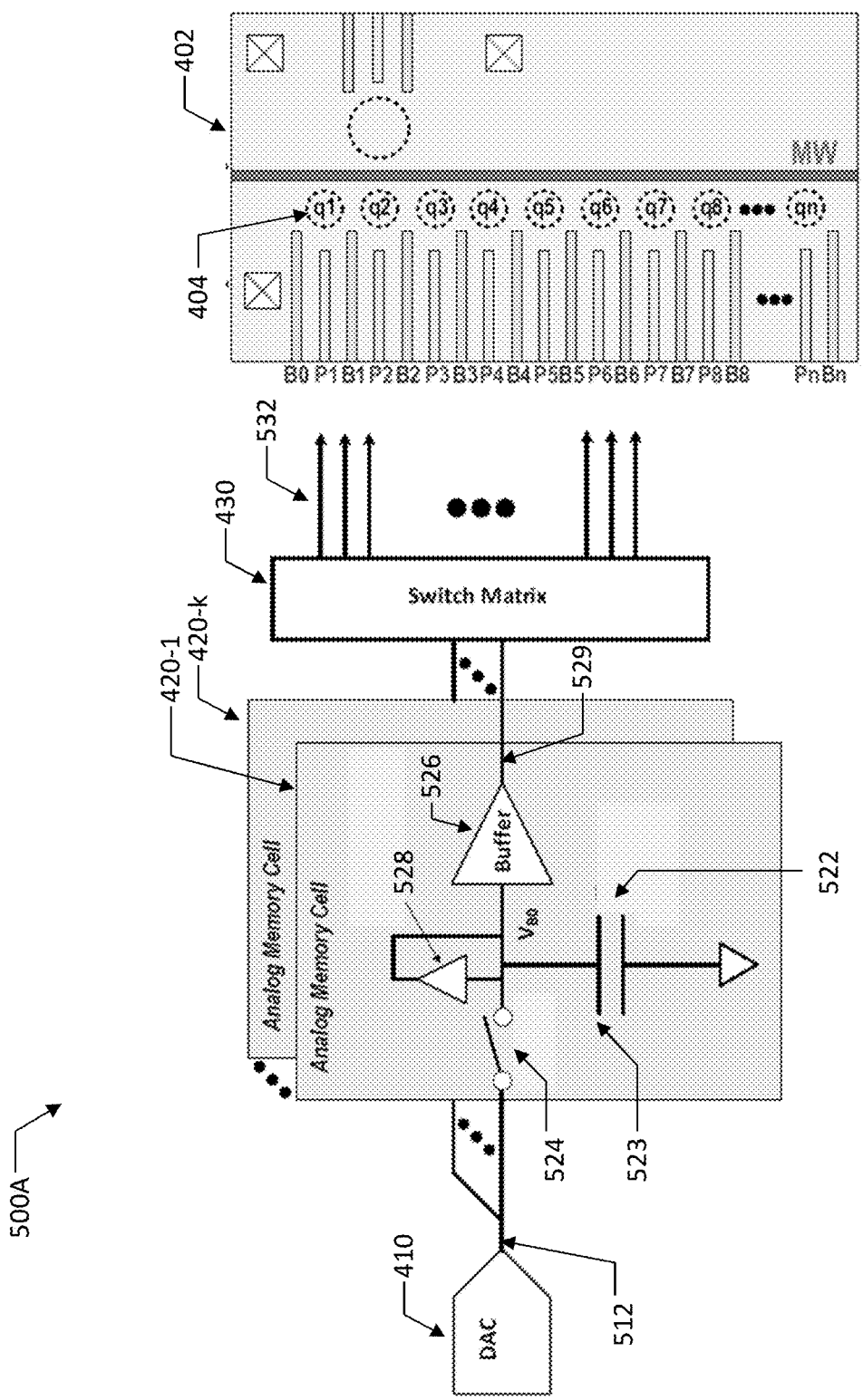
FIG. 17A provides a schematic illustration of a first example implementation of the quantum circuit assembly of FIG. 16, according to some embodiments of the present disclosure.
Figure 17B:
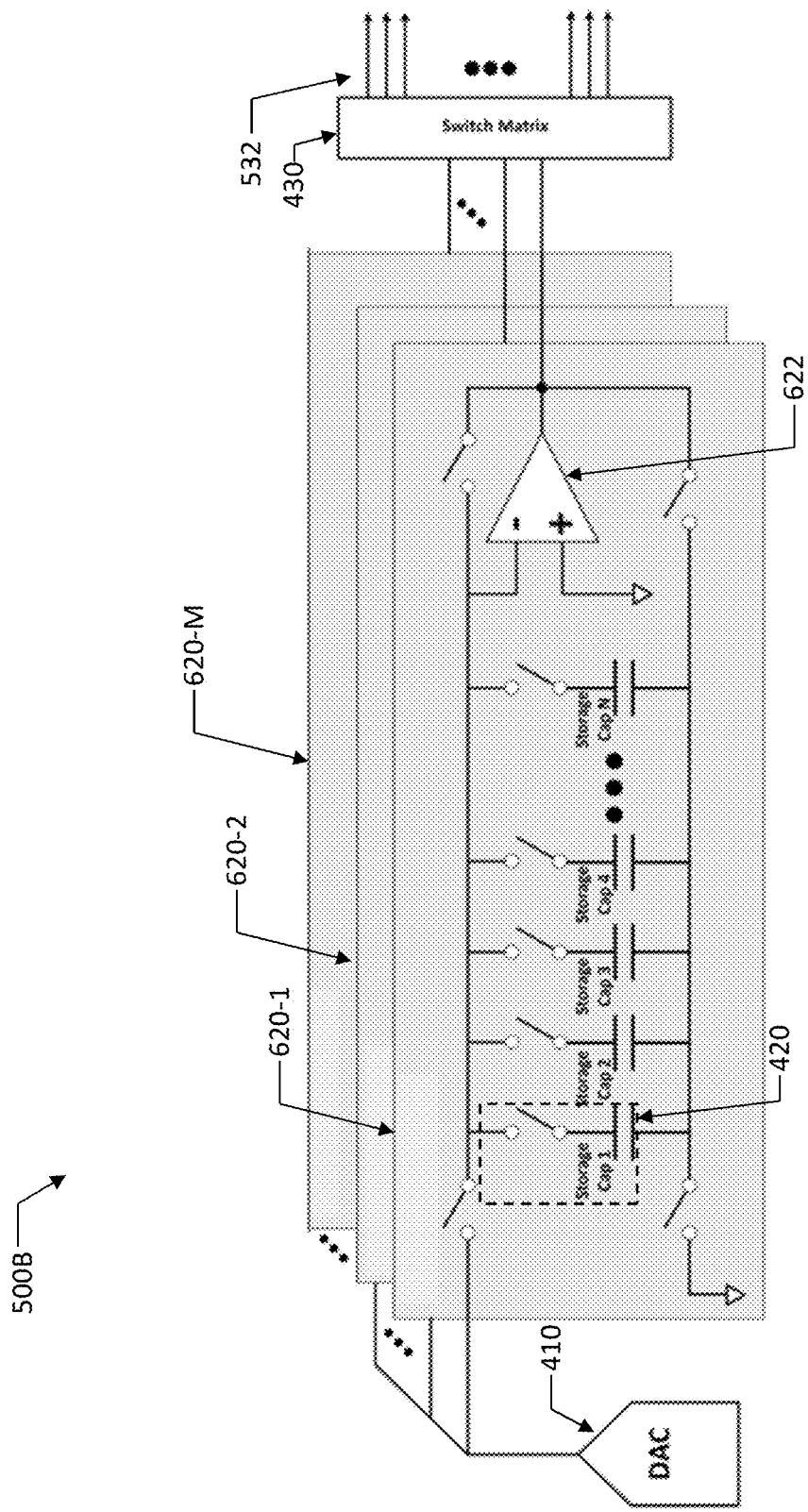
FIG. 17B provides a schematic illustration of a second example implementation of the quantum circuit assembly of FIG. 16, according to some embodiments of the present disclosure.

FIGS. 17A and 17B provide two different example implementations of the quantum circuit assembly 400 shown in FIG. 16. Therefore, elements of FIGS. 17A and 17B with the same reference numerals as those used in FIG. 16 are supposed to indicate analogous or the same elements, or example implementations of such elements, as those described with reference to FIG. 16 so that, in the interests of brevity, their description is not repeated for FIGS. 17A and 17B and only the specifics and differences are described.

FIG. 17A provides a schematic illustration of a quantum circuit assembly 500A, which is a first example implementation of the quantum circuit assembly 400 of FIG. 16. The example of FIG. 17A illustrates that, in some embodiments, the quantum circuit component 402 may be implemented as the quantum circuit component 202, described above.

The example of FIG. 17A further illustrates that, in some embodiments, a given analog memory cell 420 may include a charge storage capacitor 522 and a sampling switch 524 configured to connect or disconnect the capacitor 522 from an output 512 of the DAC 410. The sampling switch 524 may be in a first position (e.g., closed) at some times so that the analog value/signal generated by the DAC 410 may be stored in the analog memory cell 420 in which the switch 524 is included, e.g., as a charge on the capacitor 522. The switch 524 may be in a second position (e.g., open) at other times so that the analog value/signal that may be generated by the DAC 410 is not stored in the analog memory cell 420 in which the switch 524 is included.

The example of FIG. 17A further illustrates that, in some embodiments, a given analog memory cell 420 may include a buffer 526 coupled between one terminal 523 of the capacitor 522 (the other terminal of the capacitor 522 may be coupled to ground, as shown in FIG. 17A) and the output terminal 529 of the analog memory cell 420. The buffer 526 may be included to isolate the capacitor 522 from the output of the analog memory cell 420 and keep the stored analog value/signal same during qubit operation.

Still further, the example of FIG. 17A illustrates that, in some embodiments, a given analog memory cell 420 may include a charge hold feedback circuit 528, configured to reduce/compensate leakage of the charge stored on the capacitor 522.

FIG. 17A further illustrates an output 532 provided from the switching arrangement 430 to the quantum circuit component 402. The output 532 may include the control signals for different gates of the quantum circuit component 402, the control signals provided based on the analog values stored in different analog memory cells 420.

FIG. 17B provides a schematic illustration of a quantum circuit assembly 500B, which is a second example implementation of the quantum circuit assembly 400 of FIG. 16. The example of FIG. 17B does not specifically illustrate the quantum circuit component 402 in order to not clutter the drawing, but only illustrates the output 532 that would be provided from the switching arrangement 430 to the quantum circuit component 402, e.g., as shown in FIG. 17A.

The example of FIG. 17B further illustrates that, in some embodiments, a given analog memory cell 420 may be included in a memory array unit 620-1 along a plurality of other analog memory cells 420 (only one of which is labeled in FIG. 17B with a reference numeral in order to not clutter the drawing, but N of which are shown). A single operational amplifier 622 may be shared among the N analog memory cells 420 of the memory array unit 620-1, which may enable enhancing the memory density. As shown in FIG. 17B, in some embodiments, M of such memory array units 620 may be implemented, thus realizing N×M analog memory cells 420. In some embodiments, each analog memory cell 420 of the memory array units 620 of FIG. 17B may be implemented as shown in FIG. 17A. FIG. 17B further illustrates various switches configured to selectively connect or disconnect the individual ones of the memory units 620 and/or of the individual analog memory cells 420 within a given memory unit 620 to the DAC 410 and/or to the amplifier 622.

To summarize, the quantum circuit assemblies described herein may use analog random access memory (ARAM), e.g., an array of the analog memory cells 420, to first store all required analog voltages in ARAM before qubit operations by using only a single DAC, e.g., the DAC 410. Since all required voltages are already stored in ARAM, during qubit operations, proper DC values can be readily delivered to gates of a quantum circuit component, e.g., the quantum circuit component 402, through a switch matrix, e.g., the switching arrangement 430, with a relatively high speed. Advantageously, by pre-generating the required analog voltages before qubit operations, in some embodiments only one, or a few of, DACs 410 may be used, regardless of the number of qubits 404. Therefore, quantum circuit assemblies disclosed herein may be scalable to qubit arrays with large numbers of qubits. In some embodiments, the DAC 410 may have an 18-bit amplitude resolution but does not need to be high-speed. Furthermore, DC value update rate can be very fast and may only be limited by the switching speed of the switching arrangement 430. For example, the DC value update rate may be greater than about 1 GHz. In some implementations, the analog memory cells 420 may achieve very low power consumption (e.g., less than a microwatt) and very high memory density. In some embodiments, the array of the analog memory cells 420 may be placed close to the quantum circuit component 402, e.g., in the same chamber of a cooling apparatus (e.g., in a 0.1K chamber), or at the next chamber of a cooling apparatus (e.g., in a 4K chamber) to minimize the routings between the quantum circuit component 402 and the array of the analog memory cells 420, which may substantially reduce cable-related thermal loadings. Furthermore, to support a massive qubit array with an even greater number of qubits, the array of the analog memory cells 420 could be integrated together with the quantum circuit component 402, e.g., in the same package, or on the same die/substrate, with a few input/output routings. When operated in a cooling apparatus (e.g., in a 4K or even in a 0.1K chamber), the leakage can be very small which may be particularly advantageous for using the ARAM approach described herein.

Example Devices and Systems

Quantum circuit components that may be integrated with a DAC configured to pre-generate analog values for performing qubit operations and a plurality of analog memory cells configured to store the pre-generated analog values as described above may be implemented using any kind of qubit devices or included in any kind of quantum processing devices/structures. Some examples of such devices/structures are illustrated in FIGS. 18A-18B, 19, and 20.

Figure 18B:
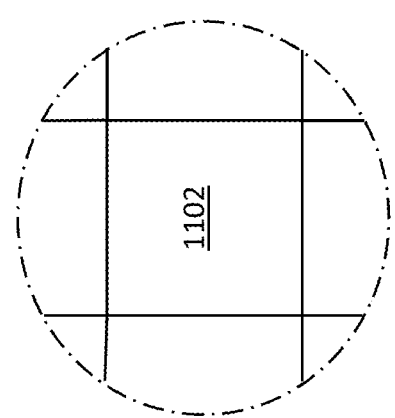
FIGS. 18A and 18B are top views of a wafer and dies that may include at least portions of one or more of quantum circuit assemblies disclosed herein.
Figure 18A:
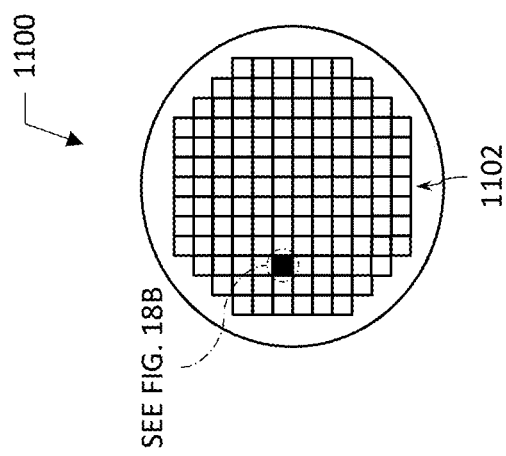

FIGS. 18A-18B are top views of a wafer 1100 and dies 1102 that may be formed from the wafer 1100, according to some embodiments of the present disclosure. The dies 1102 may include any of the qubit devices disclosed herein, e.g., the qubit devices described with reference to FIGS. 1-13, any further embodiments of such qubit devices as described herein, or any combinations of such qubit devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component, e.g., the quantum circuit component 402 as described herein. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 20) or other logic that is configured to store information in the memory devices or execute instructions stored in the memory array.

Figure 19:
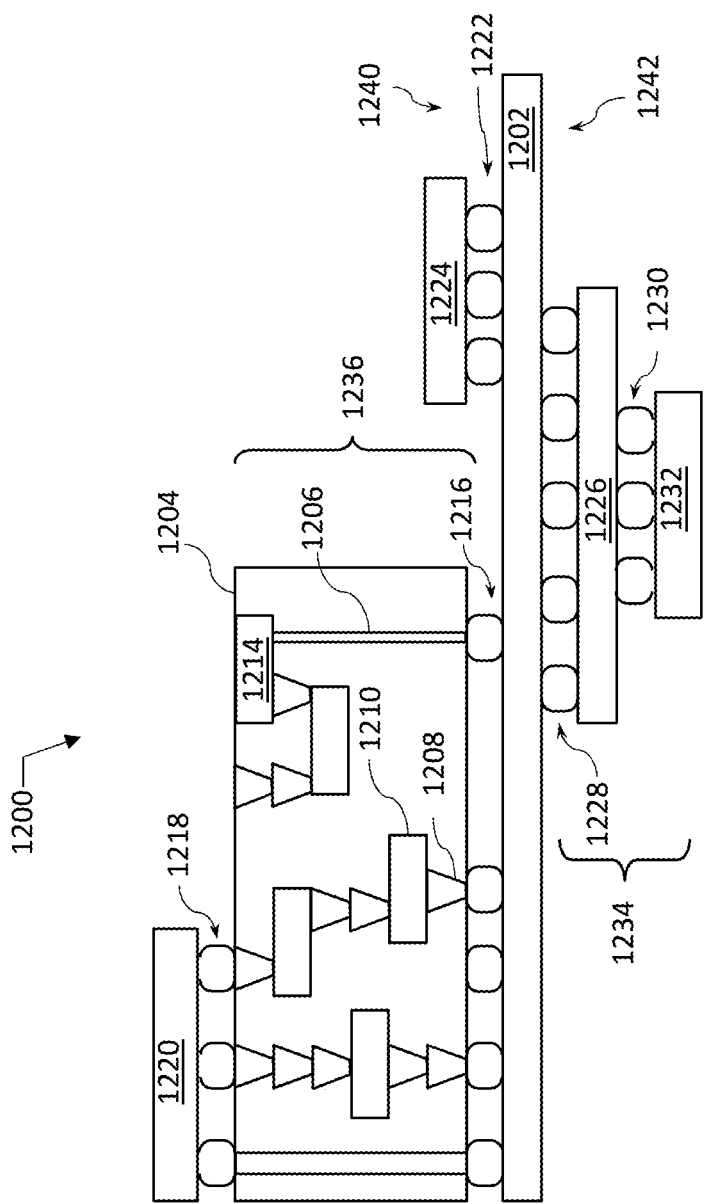
FIG. 19 is a cross-sectional side view of a device assembly that may include at least portions of one or more of quantum circuit assemblies disclosed herein.

FIG. 19 is a cross-sectional side view of a device assembly 1200 that may be included in any of the embodiments of the quantum circuit components disclosed herein. For example, in various embodiments, the device assembly 1200 may be included in, or may include, the quantum circuit component 402. In general, the device assembly 1200 may be integrated with a quantum circuit assembly that includes a DAC configured to pre-generate analog values for performing qubit operations and a plurality of analog memory cells configured to store the pre-generated analog values, as described herein, e.g., the quantum circuit assembly 400. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 19 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 19), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 19, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g. a package including any of the qubit devices disclosed herein, e.g. the qubit devices described with reference to FIGS. 1-13, any further embodiments of such qubit devices as described herein, or any combinations of such qubit devices; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 19, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any qubit devices disclosed herein, e.g. the qubit devices described with reference to FIGS. 1-13, any further embodiments of such qubit devices as described herein, or any combinations of such qubit devices; or may be a conventional IC package, for example. In some embodiments, the package 1224 may take the form of any of the embodiments of the quantum circuit component 402 to be integrated with a DAC configured to pre-generate analog values for performing qubit operations and a plurality of analog memory cells configured to store the pre-generated analog values as described herein.

The device assembly 1200 illustrated in FIG. 19 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 20:
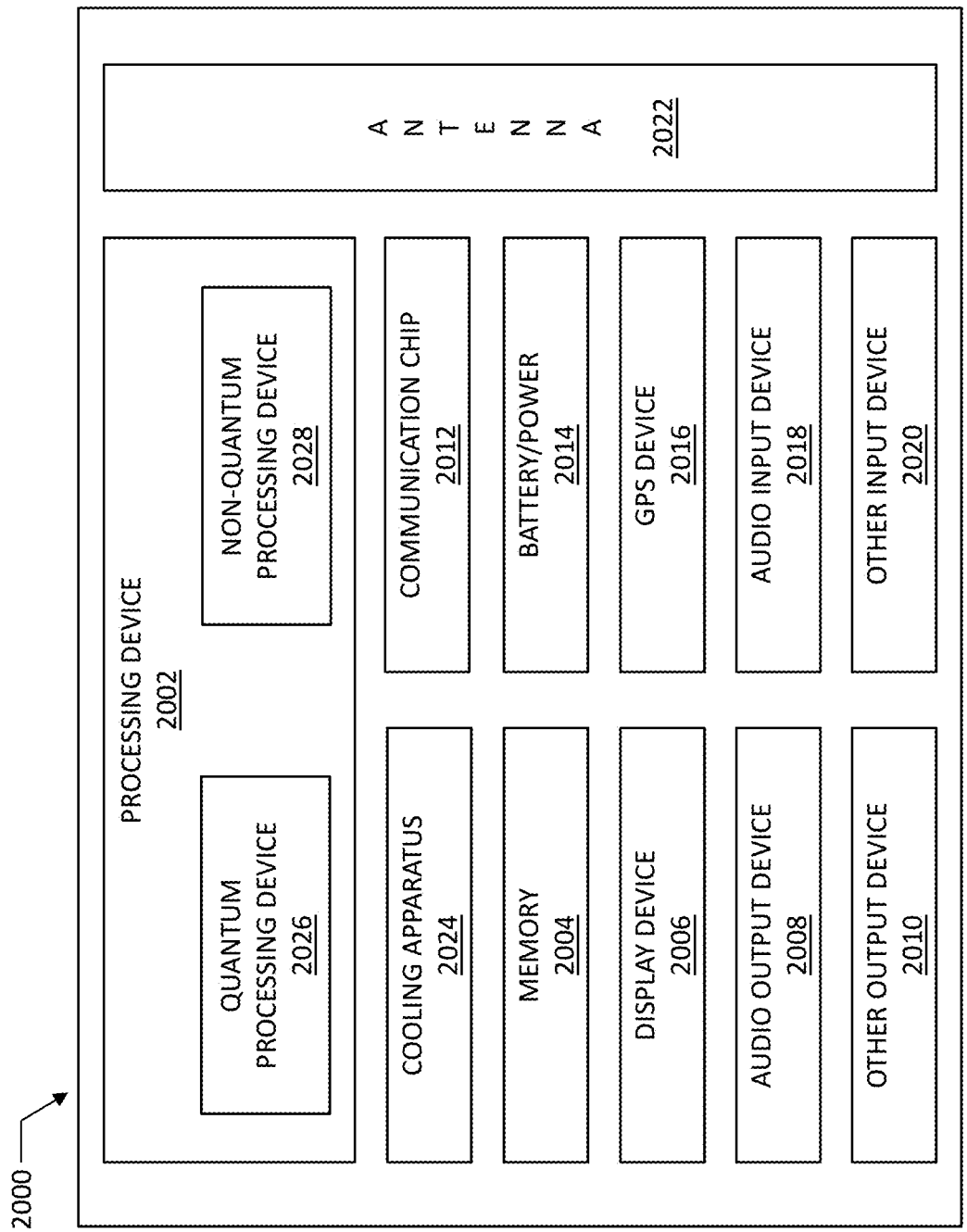
FIG. 20 is a block diagram of an example quantum computing device that may include one or more of quantum circuit assemblies disclosed herein, in accordance with various embodiments.

FIG. 20 is a block diagram of an example quantum computing device 2000 that may include any of the qubit devices disclosed herein, e.g. the qubit devices described with reference to FIGS. 1-13, any further embodiments of such qubit devices as described herein, or any combinations of such qubit devices. A number of components are illustrated in FIG. 20 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 20, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030, and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). In various embodiments, the quantum processing device 2026 may include any of the quantum circuit assemblies with a DAC configured to pre-generate analog values for performing qubit operations and a plurality of analog memory cells configured to store the pre-generated analog values as disclosed herein, e.g. one or more of the quantum circuit assemblies 400. The quantum processing device 2026 may perform data processing by performing operations on the qubits of the one or more of the quantum circuit assemblies 400, and monitoring the result of those operations. For example, as discussed above, during the qubit operations, different qubits may be allowed to interact, the quantum states of different qubits may be set or transformed, and the quantum states of different qubits may be read. At least some of these operations may be performed by providing control signals based on the analog values pre-generated by the DAC 410 and stored in the analog memory cells 420, as descried herein. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum circuit assembly that includes a quantum circuit assembly having a quantum circuit component, a plurality/array of analog memory cells, and a DAC configured to sequentially generate analog values to be stored in different ones of the analog memory cells. The quantum circuit component includes a plurality of qubit devices operable by selectively applying control signals (e.g., DC signals, e.g. analog signals, e.g., analog voltage signals) to a plurality of terminals of the plurality of qubit devices. The quantum circuit assembly further includes a switching arrangement configured to, during operation of the quantum circuit component, selectively apply control signals to the plurality of terminals of the plurality of qubit devices, where each control signal is applied by the switching arrangement electrically connecting an output terminal of a different analog memory cell of the array of analog memory cells to one of the plurality of terminals of the plurality of qubit devices. In this manner, a control signal applied to a given terminal at a given time is based on (i.e., is indicative of, or depends on) the analog value that was stored in the analog memory cell that has an output terminal connected, by the switching arrangement, to said terminal.

Example 2 provides the quantum circuit assembly according to example 1, where the qubit devices are quantum dot qubit devices, at least one quantum dot qubit device includes a plunger gate terminal as one of the plurality of terminals of the plurality of qubit devices, and where selectively applying control signals to the plurality of terminals of the plurality of qubit devices includes applying a plunger gate voltage to the plunger gate terminal of the at least one quantum dot qubit device to control formation of one or more quantum dots in the at least one quantum dot qubit device.

Example 3 provides the quantum circuit assembly according to example 1, where the qubit devices are quantum dot qubit devices, each of at least two quantum dot qubit devices includes a plunger gate terminal and a barrier gate terminal as some of the plurality of terminals of the plurality of qubit devices, and where selectively applying control signals to the plurality of terminals of the plurality of qubit devices includes applying a barrier gate voltage to at least one barrier gate terminal of the at least two quantum dot qubit devices to control a potential barrier between the plunger gate terminals of the at least two quantum dot qubit devices for 2-qubit gate operation/entanglement.

Example 4 provides the quantum circuit assembly according to any one of the preceding examples, where electrically connecting the output terminal of the analog memory cell to the one of the plurality of terminals of the plurality of qubit devices is configured to transfer a charge indicative of the analog value stored in the analog memory cell to the one of the plurality of terminals of the plurality of qubit devices.

Example 5 provides the quantum circuit assembly according to any one of the preceding examples, where the analog values are stored in the different ones of the analog memory cells by storing in the different ones of the analog memory cells electric charges indicative of the analog values.

Example 6 provides the quantum circuit assembly according to any one of the preceding examples, where the control signals are DC voltage signals, e.g., DC voltage pulses.

Example 7 provides the quantum circuit assembly according to any one of the preceding examples, where one or more of the analog memory cells, the DAC, and the switching arrangement are integrated on a single substrate with the quantum circuit component.

Example 8 provides the quantum circuit assembly according to any one of the preceding examples, where each of the analog memory cells includes a charge storage capacitor and a switch configured to connect or disconnect the capacitor from an output of the DAC.

Example 9 provides the quantum circuit assembly according to example 8, where the each of the analog memory cells further includes a buffer coupled between one terminal of the capacitor and the output terminal of the analog memory cell.

Example 10 provides the quantum circuit assembly according to examples 8 or 9, where the each of the analog memory cells further includes a charge hold feedback circuit configured to reduce leakage of a charge on the capacitor.

Example 11 provides a quantum circuit assembly that includes a quantum circuit component including one or more spin qubit devices and a plurality of gates for performing one or more operations using the one or more spin qubit devices, and further includes a DAC configured to generate a first analog value and, following generation of the first analog value, generate a second analog value. The quantum circuit assembly also includes a plurality of analog memory cells and a switching arrangement. The plurality of analog memory cells include a first analog memory cell configured to store a first charge indicative of (as used herein, the phrase "A indicative of B" may, e.g., include A being based on B) the first analog value, and a second analog memory cell configured to store a second charge indicative of the second analog value. The switching arrangement is configured to apply a first signal to a first gate of the plurality of gates, the first signal indicative of the first charge, and apply a second signal to a second gate of the plurality of gates, the second signal indicative of the second charge.

Example 12 provides the quantum circuit assembly according to example 11, where the first gate and the second gate are different gates of the plurality of gates.

Example 13 provides the quantum circuit assembly according to example 12, where a time when the switching arrangement applies the first signal to the first gate at least partially overlaps with a time when the switching arrangement applies the second signal to the second gate. For example, in some embodiments where the first and second gates are different gates, the switching arrangement may apply the first and second signals to the first and second gates substantially simultaneously. In other embodiments where the first and second gates are different gates, the switching arrangement may apply the first and second signals to the first and second gates at different (i.e., non-overlapping) times.

Example 14 provides the quantum circuit assembly according to example 11, where the first gate is same as the second gate and where the switching arrangement is configured to apply the first and second signals at different (i.e., non-overlapping) times (e.g., sequentially).

Example 15 provides the quantum circuit assembly according to any one of examples 11-14, where the switching arrangement is configured to apply the first signal by electrically connecting the first analog memory cell, with the first charge stored thereon, to the first gate, and further configured to apply the second signal by electrically connecting the second analog memory cell, with the second charge stored thereon, to the second gate.

Example 16 provides the quantum circuit assembly according to any one of examples 11-15, where the first signal is a first DC pulse (either DC voltage or DC current pulse) and the second signal is a second DC pulse (either DC voltage or DC current pulse).

Example 17 provides the quantum circuit assembly according to any one of examples 11-16, where the one or more operations are performed by applying the first signal to the first gate and/or applying the second signal to the second gate.

Example 18 provides the quantum circuit assembly according to any one of examples 11-17, where the one or more operations include one or more of an initialization of at least one of the one or more spin qubit devices, a readout of at least one of the one or more spin qubit devices, a single-gate qubit operation using at least one of the one or more spin qubit devices, and a multi-gate (e.g., two-gate) qubit operation using at least one of the one or more spin qubit devices.

Example 19 provides a quantum circuit assembly that includes a quantum circuit component including a first qubit device and a second qubit device, the first and second qubit devices operable by providing DC signals to one or more terminals of the quantum circuit component. The quantum circuit assembly further includes a plurality of analog memory cells, the plurality including a first analog memory cell and a second analog memory cell, and a DAC configured to sequentially generate a first analog signal to be stored in the first analog memory cell and a second analog signal to be stored in the second analog memory cell. The quantum circuit assembly also includes a switching arrangement configured to, during operation of the quantum circuit component, apply a first DC signal to a first terminal of the quantum circuit component and apply a second DC signal to a second terminal of the quantum circuit component. The first DC signal may be applied by the switching arrangement connecting an output of the first analog memory cell storing the first analog signal to the first terminal of the quantum circuit component. The second DC signal may be applied by the switching arrangement connecting an output of the second analog memory cell storing the second analog signal to the second terminal of the quantum circuit component.

Example 20 provides the quantum circuit assembly according to example 19, where the first and second analog memory cells are part of an ARAM array.

Example 21 provides a quantum IC package that includes a quantum circuit assembly according to any one of the preceding examples, and further includes a further IC element, coupled to the quantum circuit assembly.

Example 22 provides the quantum IC package according to example 21, where the further IC element is coupled to the quantum circuit assembly via one or more interconnects between the further IC element and the quantum circuit assembly.

Example 23 provides the quantum IC package according to examples 21 or 22, where the further IC element is one of an interposer, a circuit board, a flexible board, or a package substrate.

Example 24 provides a quantum computing device that includes a quantum processing device including a plurality of qubit devices included in a quantum circuit assembly according to any one of the preceding examples or in a quantum IC package according to any one of the preceding examples, and further includes a memory device configured to store data generated by the plurality of qubit devices during operation of the quantum processing device.

Example 25 provides the quantum computing device according to example 24, further comprising a cooling apparatus configured to maintain a temperature of the quantum processing device below 5 degrees Kelvin.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly, comprising:
    a quantum circuit component comprising a plurality of qubit devices operable by selectively applying control signals to a plurality of terminals of the plurality of qubit devices;
    a plurality of analog memory cells;
    a digital-to-analog converter (DAC) configured to sequentially generate analog values to be stored in different ones of the analog memory cells; and
    a switching arrangement configured to, during operation of the quantum circuit component, selectively apply control signals to the plurality of terminals of the plurality of qubit devices, where each control signal is applied by the switching arrangement electrically connecting an output terminal of a different analog memory cell of the array of analog memory cells to one of the plurality of terminals of the plurality of qubit devices.

2. The quantum circuit assembly according to claim 1, wherein:
    the qubit devices are quantum dot qubit devices, at least one quantum dot qubit device includes a plunger gate terminal, and
    selectively applying control signals to the plurality of terminals of the plurality of qubit devices includes applying a plunger gate voltage to the plunger gate terminal of the at least one quantum dot qubit device to control formation of one or more quantum dots in the at least one quantum dot qubit device.

3. The quantum circuit assembly according to claim 1, wherein:
    the qubit devices are quantum dot qubit devices, each of at least two quantum dot qubit devices includes a plunger gate terminal and a barrier gate terminal, and
    selectively applying control signals to the plurality of terminals of the plurality of qubit devices includes applying a barrier gate voltage to at least one barrier gate terminal of the at least two quantum dot qubit devices to control a potential barrier between the plunger gate terminals of the at least two quantum dot qubit devices.

4. The quantum circuit assembly according to claim 1, wherein electrically connecting the output terminal of the analog memory cell to the one of the plurality of terminals of the plurality of qubit devices is configured to transfer a charge indicative of the analog value stored in the analog memory cell to the one of the plurality of terminals of the plurality of qubit devices.

5. The quantum circuit assembly according to claim 1, wherein the analog values are stored in the different ones of the analog memory cells by storing electric charges indicative of the analog values.

6. The quantum circuit assembly according to claim 1, wherein the control signals are DC voltage signals.

7. The quantum circuit assembly according to claim 1, wherein one or more of the analog memory cells, the DAC, and the switching arrangement are integrated on a single substrate with the quantum circuit component.

8. The quantum circuit assembly according to claim 1, wherein each of the analog memory cells includes a capacitor and a switch configured to connect or disconnect the capacitor from an output of the DAC.

9. The quantum circuit assembly according to claim 8, wherein the each of the analog memory cells further includes a buffer between the capacitor and the output terminal of the analog memory cell.

10. The quantum circuit assembly according to claim 8, wherein the each of the analog memory cells further includes a charge hold circuit.

11. A quantum circuit assembly, comprising:
    a quantum circuit component comprising one or more spin qubit devices and a plurality of gates for performing one or more operations using the one or more spin qubit devices;
    a digital-to-analog converter (DAC) configured to generate a first analog value and, following generation of the first analog value, generate a second analog value;
    a plurality of analog memory cells, the plurality including:
        a first analog memory cell configured to store a first charge indicative of the first analog value, and
        a second analog memory cell configured to store a second charge indicative of the second analog value; and
    a switching arrangement configured to:
        apply a first signal to a first gate of the plurality of gates, the first signal indicative of the first charge, and
        apply a second signal to a second gate of the plurality of gates, the second signal indicative of the second charge.

12. The quantum circuit assembly according to claim 11, wherein the first gate and the second gate are different gates of the plurality of gates.

13. The quantum circuit assembly according to claim 12, wherein a time when the switching arrangement applies the first signal to the first gate at least partially overlaps with a time when the switching arrangement applies the second signal to the second gate.

14. The quantum circuit assembly according to claim 11, wherein the first gate is same as the second gate and wherein the switching arrangement is configured to apply the first and second signals at different times.

15. The quantum circuit assembly according to claim 11, wherein the switching arrangement
    is configured to apply the first signal by electrically connecting the first analog memory cell, with the first charge stored thereon, to the first gate, and
    is configured to apply the second signal by electrically connecting the second analog memory cell, with the second charge stored thereon, to the second gate.

16. The quantum circuit assembly according to claim 11, wherein the first signal is a first DC pulse.

17. The quantum circuit assembly according to claim 11, wherein the one or more operations are performed by applying the first signal to the first gate and/or applying the second signal to the second gate.

18. The quantum circuit assembly according to claim 11, wherein the one or more operations include one or more of:
    an initialization of at least one of the one or more spin qubit devices, a readout of at least one of the one or more spin qubit devices, a single-gate qubit operation using at least one of the one or more spin qubit devices, and a multi-gate qubit operation using at least one of the one or more spin qubit devices.

19. A quantum circuit assembly, comprising:

a quantum circuit component comprising a first qubit device and a second qubit device, the first and second qubit devices operable by providing direct current (DC) signals to one or more terminals of the quantum circuit component;

a plurality of analog memory cells, the plurality comprising a first analog memory cell and a second analog memory cell;

a digital-to-analog converter (DAC) configured to sequentially generate a first analog signal to be stored in the first analog memory cell and a second analog signal to be stored in the second analog memory cell; and a switching arrangement configured to, during operation of the quantum circuit component, apply a first DC signal to a first terminal of the quantum circuit component and apply a second DC signal to a second terminal of the quantum circuit component, wherein:

the first DC signal is applied by connecting an output of the first analog memory cell storing the first analog signal to the first terminal of the quantum circuit component, and the second DC signal is applied by connecting an output of the second analog memory cell storing the second analog signal to the second terminal of the quantum circuit component.

20. The quantum circuit assembly according to claim 19, wherein the first and second analog memory cells are part of an analog random access memory (ARAM) array.

* * * * *